July 14, 1970 NOBUO NAKAYAMA ET AL 3,520,732

PHOTOVOLTAIC CELL AND PROCESS OF PREPARATION OF SAME

Filed Oct. 22, 1965 2 Sheets-Sheet 1

Nobuo Nakayama
Eiichi Hirota
Tadashi Shiraishi
Tadashi Yamanaka
INVENTORS

BY Wenderoth, Lind & Ponack
ATTORNEYS

PHOTOVOLTAIC CELL AND PROCESS OF PREPARATION OF SAME

Filed Oct. 22, 1965 2 Sheets-Sheet 2

Nobuo Nakayama
Eiichi Hirota
Tadashi Shiraishi
Tadashi Yamanaka
INVENTORS

BY Wenderoth, Lind & Ponack
ATTORNEYS

United States Patent Office 3,520,732
Patented July 14, 1970

3,520,732

PHOTOVOLTAIC CELL AND PROCESS OF PREPARATION OF SAME

Nobuo Nakayama, Hirakata-shi, Eiichi Hirota, Sakai-shi, and Tadashi Shiraishi and Tadashi Yamanaka, Osaka-shi, Japan, assignors to Matsushita Electric Industrial Co., Ltd., Osaka, Japan Filed Oct. 22, 1965, Ser. No. 500,729
Int. Cl. H01l 7/00, 15/04
U.S. Cl. 136—89 8 Claims

ABSTRACT OF THE DISCLOSURE

Photovoltaic cells are provided comprising a combination of a p-type semiconductor plate in single crystal or poly-crystal form and an n-type semiconductor plate in single crystal or polycrystal form. Said cells are produced by hot-pressing the said p-type semiconductor plate and the n-type semiconductor plate into a single laminated body at a temperature ranging from 300° C. to 600° C. and at a pressure of 10 to 1000 kg./cm.$^2$.

This invention relates to a novel combination of p-type semiconductor and n-type semiconductor for use in photovoltaic cells, in electroluminescent elements, in rectifiers and others. It also relates to a method of preparation of said combination.

More specifically the invention relates to novel, highly efficient, simply manufactured photovoltaic cells which are usefully employed to power space vehicles; telephone systems; transistorized radio receivers and transmitters; transistorized test equipment and control circuits; to charge storage batteries and energy storage capacitors; etc.

As is well known, a p-n junction of semiconductor material produces a very efficient photovoltaic device. Especially, the silicon p-n junction photovoltaic cell is the most efficient device ever developed for converting the energy of sunlight into electricity. The silicon cell, however, is expensive and unstable at high temperatures, humidity and an intense radiation. Recently much attention has been paid to other types of photovoltaic cell elements comprising compound semiconductors such as gallium arsenide, cadmium sulfide, lead sulfide, etc. Especially, II–VI compound semiconductors doped with copper are of interest for this purpose. According to prior techniques the p-n junction has been formed by a vacuum evaporation technique or a chemical deposition technique.

For example, a thin film of copper is deposited onto a plate of n-type cadmium sulfide in a single crystal or polycrystal form by a vacuum evaporation technique and subsequently heated in order to form a p-n junction. A plate of n-type cadmium telluride, for example, is provided with a thin film of copper sulfide by a chemical decomposition of copper compound. Such techniques are bound up with difficult control of the compositions of deposited materials and consequently are of low reproducibility. The most undesirable disadvantage of prior techniques is that only particular combinations can be easily and reproducibly formed by those techniques, i.e., the deposited materials are restricted to materials which form a thin layer in a desired composition by vacuum or chemical deposition on a basic semiconductor plate at an appropriate temperature and in an appropriate atmosphere. It is desirable to provide a new process which produces a p-n junction comprising any desired materials in exactly desired compositions.

It is an object of the present invention to provide a photovoltaic cell element comprising a new combination of p-type semiconductor and n-type semiconductor.

It is another object of the invention to provide a photovoltaic cell element in high efficiency and at low cost, comprising sintered semiconductors.

It is still further object of the invention to provide a new process for preparation of a photovoltaic cell element comprising any desired combinations.

Briefly stated, the characteristic feature of the invention is the employment of hot pressing techniques to form a p-n junction, under specified conditions.

More details of the invention will become apparent upon consideration of the following description taken together with the accompanying drawings in which.

A cell of the present invention can be manufactured as follows. Thin plates of p- and n-type semiconductor material are made from polycrystals or single crystals. The polycrystals can be prepared by sintering or melting in per se conventional manner. It is necessary that one of the two plates be sufficiently transparent, and that the electrical resistance of the two plates be lower than 10 ohm-cm. Any p- and n-type semiconductors satisfying the above requirements are operable for a formation of a new combination of photovoltaic cell. The following materials can be employed: As a p-type semiconductor, chalcogenide of copper such as copper sulfide, copper selenide and copper telluride and p-type cadmium sulfide. As an n-type semiconductor, II–VI compounds such as cadmium sulfide, cadmium selenide, cadmium telluride and zinc selenide. The two plates of p- and n-type materials are attached together and placed in a die for hot pressing. Hot pressing may be performed by a per se well known method. The die may be formed of any high temperature materials such as graphite or high temperature alloys. It is desirable to fill an inert powder such as graphite, alumina and boron nitride around the laminated plate in the die. A particularly desirable condition for formation of p-n junction will be illustrated in the following descriptions.

Figures 1, 4:
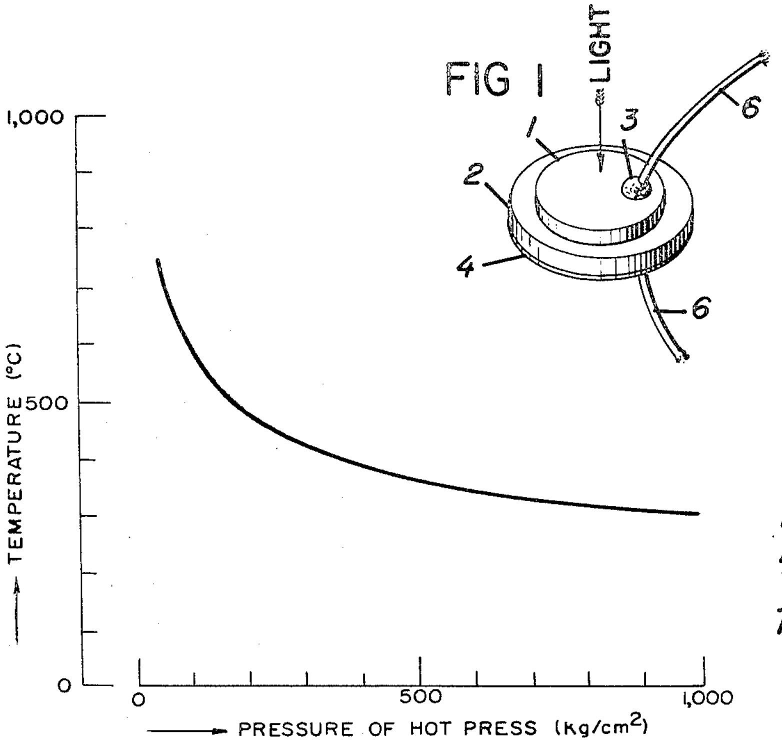
FIG. 1 is a perspective elevational view of a photovoltaic cell according to the invention.
FIG. 4 is a graphic representation of the relation between hot pressing pressure and hot pressing temperature for obtaining optimum characteristics of photovoltaic cell in accordance with the present invention.
Figure 2:
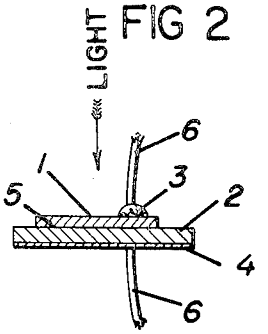
FIG. 2 is a cross-sectional view through the photovoltaic cell illustrated in FIG. 1.

A laminated body obtained by the hot pressing is shown in FIG. 1 and FIG. 2. A p-n junction 5 is formed at the interface of thin plates 1 and 2 comprising, for example, n-type semiconductor and p-type semiconductor, respectively. The to plate in the combination shown in FIGS. 1 and 2 must be transparent. The bottom plate 2 is provided with an ohmic electrode 4 over the surface thereof in any per se conventional manner such as vacuum deposition or painting. Top plate 1 is provided with an ohmic electrode 3 in per se known manner. Lead wires 6 are soldered to both electrodes.

It is preferable to envelop the combination in the die with an inert powder such as graphite, alumina or boron nitride during hot pressing in order to prevent cracking of the plates. Compacting pressure is preferably applied on both punches, i.e., a double action punch is desirable for a uniform pressure from upper and bottom punches. A very thin plate, thinner than 0.1 mm., has a tendency to crack during hot press. A thick plate is not desirable from the standpoint of transparency. A plate in a thickness of 0.1 mm. to 0.4 mm. is desirable from the standpoint of cracking and transparency. It is important that prior to hot pressing, the contacted surface of each of plates 1 and 2 be polished optically flat with very fine lapping powder and then slightly etched with dilute aqueous HCl.

The conditions of hot-pressing must be carefully adjusted as follows for manufacturing a highly efficient cell: (1) The temperature of hot-pressing is between 300° C. and 600° C. (2) The pressure of hot-pressing is between 100 kg./cm.$^2$ and 1000 kg./cm.$^2$. When the pressing temperature is lower than 300° C., the laminated plates do not stick together or crack and fail to produce an entirely satisfactory cell. A pressing temperature higher than 600° C. results in a low photocurrent and photovoltage.

Figure 3:
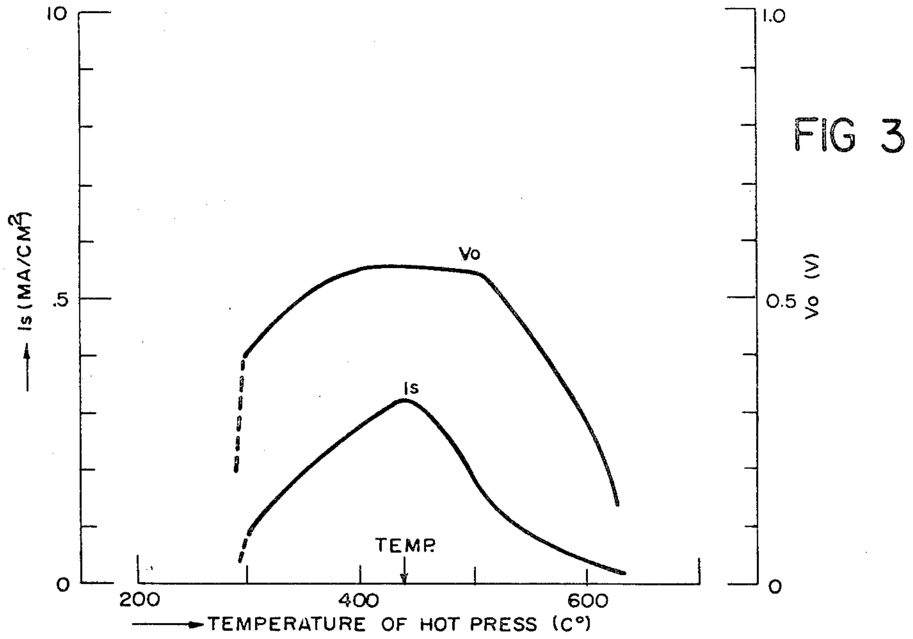
FIG. 3 is a graphic representation of the effects of hot pressing temperature on the short circuit photocurrent and open circuit photovoltage of the novel photovoltaic cell.

Referring to FIG. 3 showing the effects of the hot pressing temperature on the short circuit photocurrent anr open circuit photovoltage of a cell obtained by hot-pressing a combination of p-type cadmium sulfide and n-type cadmium sulfide at a pressure of 250 kg./cm.$^2$, an operable hot-pressing temperature is clearly between 300° C. and 600° C. A desirable temperature for hot-pressing is 410° to 470° C. and the most desirable temperature is 440° C. in accordance with the present invention. This optimum temperature is a function of hot-pressing pressure as shown in FIG. 4. As the pressure of hot-pressing becomes higher, the optimum temperature becomes lower. The optimum temperature decreases to a temperature lower than 300° C., at a pressure higher than 1000 kg./cm.$^2$, while a lower pressure than 100 kg./cm.$^2$ elevates the optimum temperature over 600° C. The hot pressing pressure also must be controlled in connection with the hot-pressing temperature in order to produce an entirely satisfactory cell element. It is desirable to choose a pressure of hot-pressing between 100 kg./cm.$^2$ and 1000 kg./cm.$^2$. The further desirable conditions of hot-pressing are: (1) The time period of hot-pressing is between 10 seconds to 10 minutes. (2) The atmosphere of hot-pressing is required to be an inert gas atmosphere, such as nitrogen gas and argon gas, or reduced air at a pressure of $10^{-2}$ to $10^{-6}$ mm. Hg. (3) The heating anr cooling rates are between 10° C. to 100° C. per unit minute.

A p-type semiconductor of cadmium sulfide having low electrical resistivity can be prepared by mixing a commercially available cadmium sulfide powder with a copper sulfide (CuS) powder in weight percentages of 2 to 8% of CuS and 98% to 92% of CdS, calcining the mixed powder at a temperature ranging from 700° C. to 900° C. for 2 hours in an inert gas such as nitrogen and argon, thereafter cooling to room temperature (about 20° to 30° C.), grinding the calcined material, adding 0 to 2 weight percentages of CuS to the ground material, pressing into plates, sintering at a temperature ranging from 900° C. to 1050° C. for 1.5 hours in an inert gas such as argon and nitrogen, and furnace cooling to room temperature. The resultant material has an electric resistivity of 0.1 ohm.-cm. to 10 ohm-cm.

It is preferable for obtaining a low electrical resistivity and high mechanical strength of laminated cell that each plate of p-type or n-type semiconductor be prepared by hot-pressing technique. This hot-pressing treatment can be carried out at a temperature ranging from 700° C. to 1000° C. for 1 minute to 1 hour and at a pressure ranging from 100 kg./cm.$^2$ to 1000 kg./cm.$^2$ in an inert gas such as nitrogen and argon gas or reduced air at a temperature of $10^{-2}$ to $10^{-6}$ mm. Hg.

The following examples are given to illustrate certain preferred details of the invention, it being understood that the details of the examples are not to be taken as in any way limiting the invention thereto.

EXAMPLE 1 ($Cu_2S$—CdS)

Cupric sulfide (CuS) in a quartz tube is melted at 1180° C. for 2 hours in nitrogen gas atmosphere and thereafter slowly cooled to room temperature. The obtained material is a polycrystalline melted body of cuprous sulfide ($Cu_2S$), in chalocite structure. A further purification is carried out by a zone-refining method by using an evacuated quartz of $10^{-2}$ mm. Hg. The obtained purified body is a p-type semiconductor and exhibits a resistivity of $10^{-1}$ ohm-cm. at room temperature and a mobility of charge carried of 3 cm.$^2$/volt-sec. A plate of disk type having dimensions of 3 mm. thickness and 2.0 cm.$^2$ area is prepared.

A commercially available cadmium sulfide (CdS) powder is pressed into pellets and sintered at 800° C. in nitrogen gas atmosphere for 2 hours. Thus-obtained sintered material is an n-type semiconductor and exhibits a resistivity of $10^{-1}$ ohm-cm. A mobility of charge carrier of this n-type semiconductor is of 30 cm.$^2$/volt-sec. A plate of disk type having dimension of 0.35 mm. thickness and 0.75 cm.$^2$ area is prepared from this sintered body of n-type CdS.

The surface of the disk of both p- and n-type materials are polished into optically flat condition and then slightly etched with dilute HCl solution. The combined disks of both n-type and p-type semiconductor are put in an alloy die, enveloped with graphite powder, and hot-pressed into a single laminated body at a temperature of 400° C. and at a pressure of 200 kg./cm.$^2$ for 10 seconds and thereafter quenched. The hot pressing apparatus is of per se known construction and includes a system of high frequency induction heating and is operated by hydrostatic pressure.

Figures 5, 6:
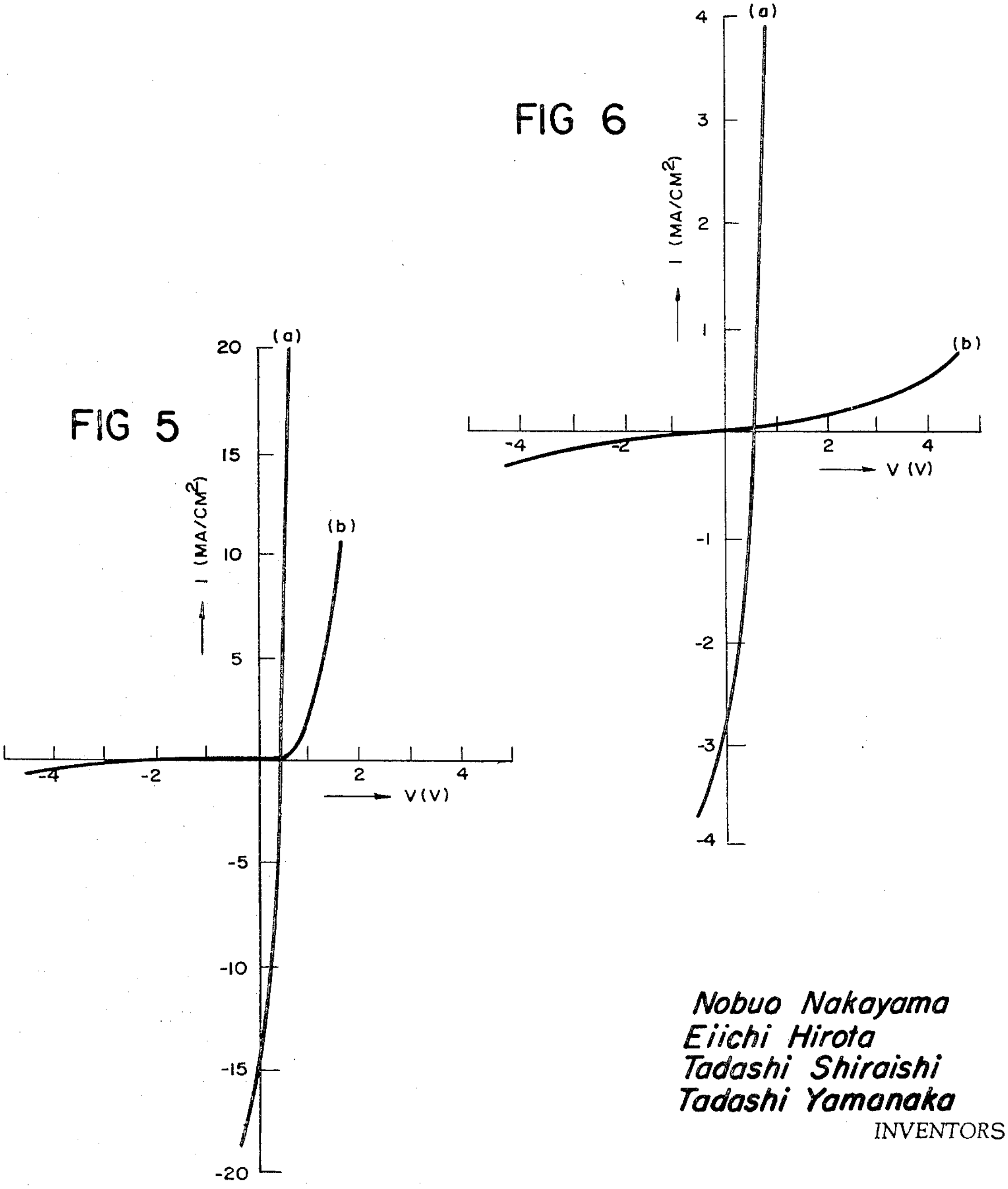
FIG. 5 and FIG. 6 are graphical illustrations of voltage versus current characteristics of a photovoltaic cell in accordance with the present invention.

An indium electrode is applied on the n-material, and a gold electrode is applied on the p-material as shown in FIG. 1 and FIG. 2. The photovoltaic effects of the thus-prepared cell is measured by exposing the cell in normally incident sun-light. Referring to FIG. 5, curve *a* shows the relation of the photovoltage versus current characteristics obtained by this measurement. The cell generates an open-circuit photovoltage of 0.5 volt and a short-circuit photocurrent of 16 milliamperes per unit area of light incident surface. The results are also shown in Table 1. The conversion efficiency of the cell is 3 percent. Curve *b* in FIG. 5 also shows the voltage versus current characteristics under no radiation. It will be readily understood from the curve *b* that the cell can be used as a rectifier having very satisfactory characteristics.

EXAMPLE 2 (CdS—CdS)

A plate of n-type cadmium sulfide is prepared by the same method as that of Example 1. A plate of p-type cadmium sulfide is prepared as follows: a commercially available cadmium sulfide powder and a cupric sulfide powder are mixed in a weight proportion of 95% of CdS and 5% of CuS. The mixture is pressed into tablets having dimensions of 20 mm. diameter and 3 mm. thickness, pre-sintered at 900° C. for 2 hours in nitrogen gas atmosphere and furnace-cooled to room temperature. The obtained presintered body is crushed and ground, mixed with 2 weight percentages of CuS, pressed into tablets having thickness of 3 mm. and area of 3.0 cm.$^2$, sintered at 950° C. for 1.5 hours in nitrogen gas atmosphere and furnace-cooled. The two p- and n-type disks are polished, etched, combined and hot-pressed at 445° C. for 20 seconds at pressures of 250 kg./cm.$^2$. The photovoltaic effects are measured with the obtained cell element in the same way as that mentioned in Example 1. An open-circuit photovoltage is 0.55 volt and short-circuit photovoltage is 3 milliamperes per unit area of light incident surface. The results are shown in Table 1 and FIG. 6, in which curve *a* represents voltage versus current characteristics with sun-light and curve *b* represents voltage versus current characteristics with no radiation.

EXAMPLE 3 ($Cu_{1.96}S$, $Cu_9S_5$, CuS—CdS)

Polycrystal bodies of copper sulfides to be used as p-type semiconductor plates are prepared as follows: (a) A polycrystal of $Cu_{1.96}S$ in djurite structure is obtained by zone-melting $Cu_2S$ at about 1 atmospheric pressure of sulfur vapor. The starting $Cu_2S$ can be prepared by the same method as that mentioned in Example 1. (b) A polycrystal of $Cu_9S_5$ in digenite structure is prepared by melting cupric sulfide, CuS, at 1200° C. in an about 1 atmospheric pressure of sulfur vapor and cooling slowly to room temperature. (c) A polycrystal of CuS in covellite structure is prepared by hot-pressing CuS powder at 200° C. and at 300 kg./cm.$^2$. P-type semiconductor plates and n-type cadmium sulfide plates are made in a similar way to that of Example 1. The two laminated plates are hot-pressed at the temperature and at the pressure designated by sample numbers 3, 4 and 5 in Table 1. The photovoltaic characteristics of so-produced cells are indicated in Table 1.

EXAMPLE 4

$$\begin{pmatrix} Cu_2Se \\ Cu_2Te \end{pmatrix} - \begin{pmatrix} CdSe, ZnSe \\ CdTe \end{pmatrix}$$

Melted bodies of copper selenide, $Cu_2Se$, and copper tulluride, $Cu_2Te$, to be used as p-type semiconductor plates are prepared as follows: (a) Polycrystals of $Cu_2Se$ and $Cu_2Te$ are prepared by melting commercially available powder of $Cu_2Se$ and $Cu_2Te$ in a quartz tube at a temperature ranging from 900° C. to 1200° C. for 2 or 3 hours in a nitrogen gas atmosphere and cooling slowly to room temperature. Sintered bodies of n-type semiconductor materials, CdSe, CdTe and ZnSe, are prepared by pressing a commercially available powder of CdSe, CdTe and ZnSe into pellets and sintering at a temperature ranging from 900° C. to 1000° C. for 2 to 3 hours in a nitrogen gas atmosphere and then cooled slowly to room temperature. Thus obtained sintered bodies of p-type and n-type materials are fabricated into disks in a similar way to the preceding examples. The various combinations of $Cu_2Se$—CdSe, $Cu_2Se$—ZnSe and $Cu_2Te$—CdTe are prepared by hot-pressing into integral form laminated bodies at a temperature ranging from 300° C. to 600° C. at a pressure of 100 to 1000 kg./cm.$^2$. The photovoltaic characteristics of the above combinations are given in connection with their preparation conditions in Table 1.

Variation and modifications may be made within the scope of the claims and portions of improvements may be used without others.

TABLE 1

| Sample No. | Combination | | Conditions of hot-pressing | | Characteristics | |
|---|---|---|---|---|---|---|
| | p-Type material | n-Type material | Temperature (° C.) | Pressure (kg./cm.$_2$) | Open circuit voltage (v.) | Short circuit current (ma. per sq. cm.) |
| 1 | Cds | CdS | 445 | 250 | 0.55 | 3 |
| 2 | $Cu_2S$ | CdS | 400 | 200 | 0.5 | 16 |
| 3 | $Cu_{1/96}S$ | CdS | 420 | 200 | 0.3 | 4 |
| 4 | $Cu_9S_5$ | CdS | 450 | 250 | 0.3 | 1.5 |
| 5 | CuS | CdS | 350 | 150 | 0.2 | 5.5 |
| 6 | $Cu_2Se$ | CdSe | 300 | 200 | 0.4 | 5 |
| 7 | $Cu_2Se$ | ZnSe | 400 | 350 | 0.65 | -------- |
| 8 | $Cu_2Te$ | CdTe | 300 | 350 | 0.7 | 10 |

We claim:

1. A photovoltaic cell comprising a combination of a p-type semiconductor plate in single crystal or polycrystal form and an n-type semiconductor plate in single crystal or polycrystal form, said combination being prepared by hot-pressing said p-type semiconductor plate and said n-type semiconductor plate into a single laminated body at a temperature ranging from 300° C. to 600° C. at a pressure of 10 to 1000 kg./cm.$^2$, said p-type semiconductor being composed of a member selected from the group consisting of copper sulfide, copper selenide, copper telluride and p-type cadmium sulfide and said n-type semiconductor being composed of a member selected from the group consisting of cadmium sulfide, cadmium selenide, cadmium telluride and zinc selenide.

2. A photovoltaic cell comprising a combination of a p-type semiconductor plate of copper sulfide in single crystal or polycrystal form and an n-type semiconductor plate of cadmium sulfide in single crystal or polycrystal form, said combination being prepared by hot-pressing said p-type semiconductor plate and said n-type semiconductor plate into a single laminated body at a temperature ranging from 300° C. to 600° C. at a pressure of 10 to 1000 kg./cm.$^2$.

3. A photovoltaic cell comprising a combination of a p-type semiconduct or plate of copper-doped cadmium sulfide in single crystal or polycrystal form and an n-type semiconductor plate of cadmium sulfide in single crystal or polycrystal form, said combination being prepared by hot-pressing said p-type semiconductor plate and said n-type semiconductor plate into a single laminated body at a temperature ranging from 300° C. to 600° C. at a pressure of 10 to 1000 kg./cm.$^2$.

4. A photovoltaic cell comprising a combination of a p-type semiconductor plate of copper selenide in single crystal or polycrystal form and an n-type semiconductor plate of cadmium selenide in single crystal or polycrystal form, said combination being prepared by hot-pressing said p-type semiconductor plate and said n-type semiconductor plate into a single laminated body at a temperature ranging from 300° C. to 600° C. at a pressure of 10 to 1000 kg./cm.$^2$.

5. A photovoltaic cell comprising a combination of a p-type semiconductor plate of copper selenide in single crystal or polycrystal form and an n-type semiconductor plate of zinc selenide in single crystal or polycrystal form, said combination being prepared by hot-pressing said p-type semiconductor plate and said n-type semiconductor plate into a single laminated body at a temperature ranging from 300° C. to 600° C. at a pressure of 10 to 1000 kg./cm.$^2$.

6. A photovoltaic cell comprising a combination of a p-type semiconductor plate of copper telluride in single crystal or polycrystal form and an n-type semiconductor plate of cadmium telluride in single crystal or polycrystal form, said combination being prepared by hot-pressing said p-type semiconductor plate and said n-type semiconductor plate into a single laminated body at a temperature ranging from 300° C. to 600° C. at a pressure of 10 to 1000 kg./cm.$^2$.

7. A photovoltaic cell comprising a combination of a p-type semiconductor plate of copper sulfide selected from the group consisting of $Cu_2S$ in chalococite structure. $Cu_{1.96}S$ in djurite structure, $Cu_9S_5$ in digenite structure and CuS in covellite structure in single crystal or polycrystal form and an n-type semiconductor plate of cadmium sulfide in single crystal or polycrystal form, said combination being prepared by hot pressing said p-type semiconductor plate and said n-type semiconductor plate into a single laminated body at a temperature ranging from 300° C. to 600° C. at a pressure of 10 to 1000 kg./cm.$^2$.

8. A process for preparation of novel photovoltaic cell elements, wherein a plate of p-type semiconductor in a polycrystal or single crystal form selected from the group consisting of copper sulfide, copper selenide, copper telluride and cadmium sulfide and a plate of n-type semiconductor in a polycrystal or single crystal form selected from the group consisting of cadmium sulfide, cadmium selenide, cadmium telluride and zinc selenide are laminated, hot-pressed at a temperature ranging from 300° C. to 600° C. at a pressure of 10 to 1000 kg./cm.$^2$ for times of 10 seconds to 10 minutes in air or inert gas atmosphere and thereafter quenched to room temperature.

References Cited

UNITED STATES PATENTS

| | | | |
|---|---|---|---|
| 2,651,700 | 9/1953 | Gans | 136—89 X |
| 2,743,201 | 4/1956 | Johnson et al. | 29—581 X |
| 2,844,640 | 7/1958 | Reynolds | 136—89 |
| 2,843,914 | 7/1958 | Koury. | |
| 3,284,252 | 11/1966 | Grimmeiss et al. | 136—89 X |
| 3,290,175 | 12/1966 | Cusane et al. | 136—89 |

WINSTON A. DOUGLAS, Primary Examiner

M. J. ANDREWS, Assistant Examiner

U.S. Cl. X.R.

29—572